US012813194B2

(12) United States Patent
Ishikawa et al.

(10) Patent No.: US 12,813,194 B2
(45) Date of Patent: Nov. 24, 2026

(54) METHOD OF MAKING A SEMICONDUCTOR DEVICE USING AN EDGE BEVEL REMOVAL SYSTEM CONTAINING A GAS NOZZLE

(71) Applicant: Sandisk Technologies, Inc., Milpitas, CA (US)

(72) Inventors: Kensuke Ishikawa, Yokkaichi (JP); Shingo Totani, Yokkaichi (JP); Fumitaka Amano, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 10 days.

(21) Appl. No.: 18/598,644

(22) Filed: Mar. 7, 2024

(65) Prior Publication Data

US 2025/0285887 A1 Sep. 11, 2025

(51) Int. Cl.
*H10P 72/00* (2026.01)
*H10P 50/66* (2026.01)

(52) U.S. Cl.
CPC ........ *H10P 72/0424* (2026.01); *H10P 50/667* (2026.01)

(58) Field of Classification Search
None
See application file for complete search history.

(56) References Cited

U.S. PATENT DOCUMENTS 6,333,275 B1 * 12/2001 Mayer ................. H01L 21/6708 438/747
8,100,081 B1 1/2012 Henri et al.
11,069,707 B2 7/2021 Tanabe et al.
11,289,388 B2 3/2022 Tanamachi et al.
11,322,466 B2 5/2022 Okina
11,342,286 B2 5/2022 Kaminaga et al.
2003/0102385 A1 * 6/2003 Nguyen .................. B05C 5/027 239/398
2005/0178401 A1 * 8/2005 Boyers ................ H01L 21/6708 216/57
2007/0169793 A1 * 7/2007 Shimada ........... H01L 21/67051 134/26
2010/0055924 A1 * 3/2010 Ganesan ............. H01L 21/6708 257/E21.228
2011/0168672 A1 * 7/2011 Harte ................... B23K 26/142 156/345.55

(Continued)

OTHER PUBLICATIONS

U.S. Appl. No. 17/932,887, filed Sep. 16, 2022, SanDisk Technologies LLC.

(Continued)

*Primary Examiner* — Shamim Ahmed

(74) *Attorney, Agent, or Firm* — THE MARBURY LAW LAW GROUP PLLC

(57) ABSTRACT

A method of performing an edge bevel removal process includes providing a nozzle assembly including a liquid dispensation nozzle configured to dispense an etchant liquid and a gas dispensation nozzle configured to dispense a gas, and performing an etchant liquid dispensation process in which a stream of the etchant liquid is dispensed from an orifice of the liquid dispensation nozzle toward a peripheral region of a top surface of a device wafer while a stream of the gas is directed at a bottom surface of the liquid dispensation nozzle.

19 Claims, 7 Drawing Sheets

(56) References Cited

U.S. PATENT DOCUMENTS

| | | | | |
|---|---|---|---|---|
| 2014/0051258 | A1* | 2/2014 | Izumoto | H01L 21/67086 156/345.23 |
| 2014/0190529 | A1* | 7/2014 | Ganesan | H01L 21/02068 134/95.1 |
| 2015/0001087 | A1* | 1/2015 | Dinneen | C25D 21/12 204/216 |
| 2015/0090302 | A1* | 4/2015 | Fujiwara | H01L 21/67051 134/99.1 |
| 2016/0178279 | A1* | 6/2016 | Velazquez | H01L 21/67051 34/236 |
| 2017/0294332 | A1 | 10/2017 | LaBrie et al. | |
| 2019/0295865 | A1* | 9/2019 | Hanawa | H01L 21/67248 |
| 2021/0098249 | A1* | 4/2021 | Fujita | B08B 3/02 |
| 2021/0126008 | A1 | 4/2021 | Tanabe et al. | |
| 2024/0087905 | A1* | 3/2024 | Kobayashi | H01L 21/3065 |

OTHER PUBLICATIONS

U.S. Appl. No. 17/932,907, filed Sep. 16, 2022, SanDisk Technologies LLC.

U.S. Appl. No. 18/451,206, filed Aug. 17, 2023, Western Digital Technologies, Inc.

* cited by examiner

METHOD OF MAKING A SEMICONDUCTOR DEVICE USING AN EDGE BEVEL REMOVAL SYSTEM CONTAINING A GAS NOZZLE

FIELD

The present disclosure relates generally to the field of semiconductor manufacturing, and specifically to a method of making a semiconductor device using an edge bevel removal system containing a gas nozzle and to the edge bevel removal system.

BACKGROUND

An edge bevel removal ("EBR") process is employed in semiconductor device manufacturing to facilitate subsequent chemical mechanical polishing of electroplated copper on a wafer and to prevent or reduce delamination and/or contamination caused by residual copper at the wafer edge. The edge bevel removal process removes peripheral regions of the electroplated copper that may have an excessively high thickness and causes difficulties in a subsequently chemical mechanical polishing process, i.e., makes complete removal of the electroplated copper from the peripheral regions difficult. Edge bevel removal results in a thickness reduction or complete removal of copper near the edge of the wafer. For example, the edge bevel removal process removes a peripheral portion of the electroplated copper by spraying a wet etchant, i.e., an etchant liquid, from an EBR nozzle at the edge of the wafer covered in copper. However, the edge bevel removal process may remove too much copper or non-uniformly remove the copper at the wafer edge (i.e., at the bevel edge of the wafer).

SUMMARY

According to an aspect of the present disclosure, a method of performing an edge bevel removal process includes providing a nozzle assembly including a liquid dispensation nozzle configured to dispense an etchant liquid and a gas dispensation nozzle configured to dispense a gas, and performing an etchant liquid dispensation process in which a stream of the etchant liquid is dispensed from an orifice of the liquid dispensation nozzle toward a peripheral region of a top surface of a device wafer while a stream of the gas is directed at a bottom surface of the liquid dispensation nozzle.

According to another aspect of the present disclosure, an edge bevel removal apparatus comprises a chuck configured to hold a wafer thereupon, and a nozzle assembly comprising a liquid dispensation nozzle configured to dispense an etchant liquid and a gas dispensation nozzle configured to dispense a gas. The liquid dispensation nozzle and the gas dispensation nozzle extend substantially parallel to each other (e.g., having lengthwise axes within zero to five degrees of each other); the liquid dispensation nozzle includes a liquid orifice aimed at a peripheral portion of the chuck; the gas dispensation nozzle is located below and radially inward relative to the liquid dispensation nozzle; and the gas dispensation nozzle includes a gas orifice aimed at a bottom surface of the liquid dispensation nozzle.

DETAILED DESCRIPTION

Figure 1C:
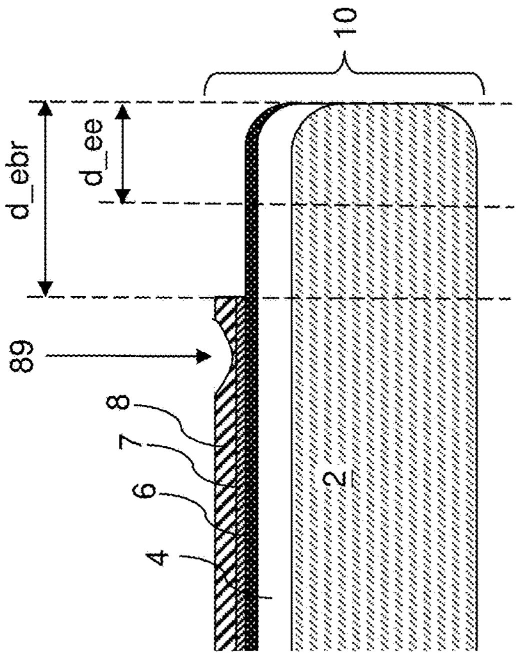
FIG. 1C (Prior Art)
FIG. 1C is a magnified view of region C of the wafer in FIG. 1B.

As discussed above, the embodiments of the present disclosure are directed to an edge bevel removal system employing a gas nozzle which emits a gas stream (e.g., gas jet) below an EBR liquid etchant nozzle and a method of operating the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process"

structure refers to a transient structure that is subsequently modified in the shape or composition of at least one component therein.

The edge bevel removal system containing a gas nozzle below the EBR wet etchant nozzle of the embodiments present disclosure prevents or reduces unintentional dripping of an etchant liquid from the EBR wet etchant nozzle within an area of a metal that is not removed by the edge bevel removal process, thereby preventing or reducing undesirable overetching of the metal from the wafer bevel edge. The gas nozzle directs a gas steam (e.g., gas jet) toward a backside surface of the EBR wet etchant nozzle. A stream (e.g., jet) of the etchant liquid is dispensed from an orifice of the nozzle toward a peripheral (i.e., edge) region of a top surface of a wafer during the edge bevel removal process, while the gas steam is directed at a bottom surface of the nozzle such that the gas stream flows along the bottom surface of the nozzle toward the orifice of nozzle. The gas steam prevents or reduces unintended dripping of droplets of the etchant liquid from the EBR wet etchant nozzle inside the inner edge of the annular edge bevel removal area. Therefore, the process yield of subsequently chemical mechanical polishing process can be increased. The various aspects of the present disclosure are now described with reference to accompanying drawings.

Figure 1A:
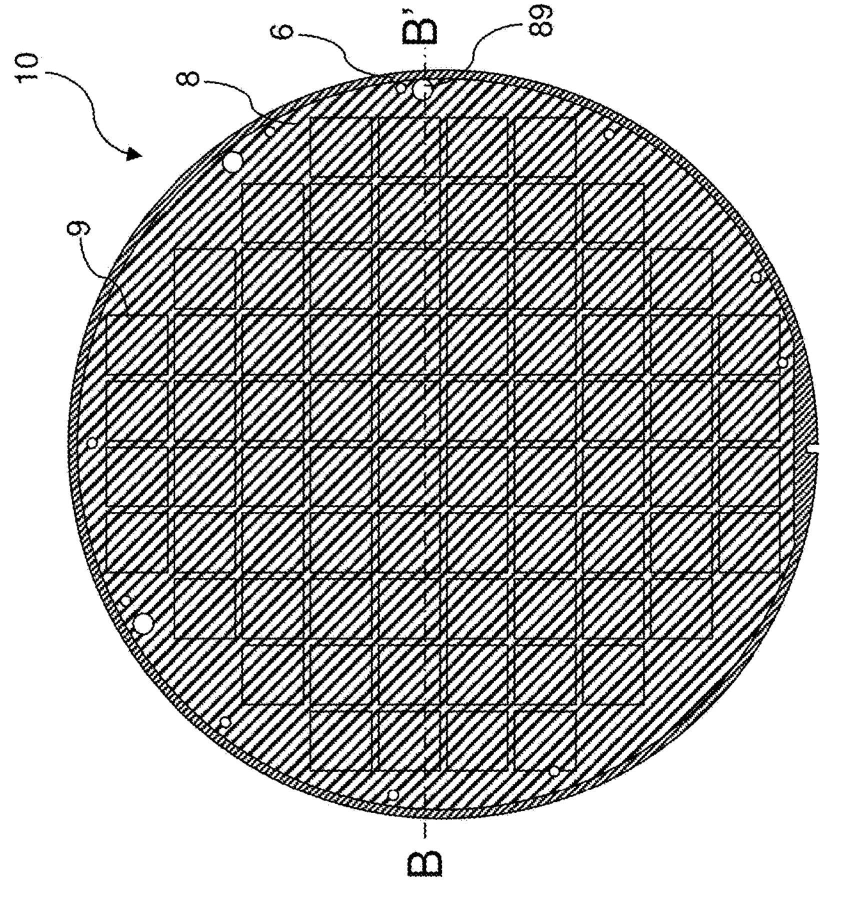
FIG. 1A (Prior Art)
FIG. 1A is a top-down view of a wafer on which an edge bevel removal process may be subsequently performed.
Figure 1B:
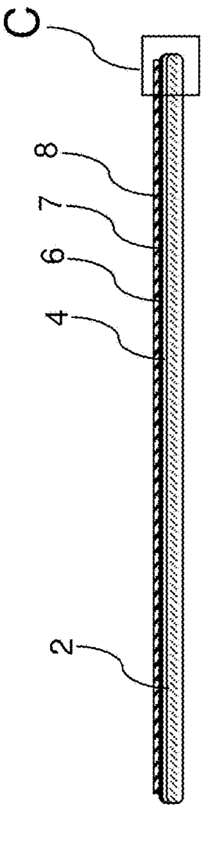
FIG. 1B (Prior Art)
FIG. 1B is a vertical cross-sectional view of the wafer along the vertical plane B-B' of FIG. 1A.

FIGS. 1A-1C illustrate a wafer that is processed with an edge bevel removal process known in the art. A device wafer 10 can include a substrate 2, such as semiconductor substrate (e.g., a silicon wafer), a device layer 4 including semiconductor devices (such as a logic circuit including field effect transistors or a memory array including a two-dimensional or three-dimensional array of memory elements) and metal interconnect structures embedded within dielectric material layers, and a metallic (i.e., electrically conductive) layer (6, 7, 8) overlying the device layer 4. The metallic layer may be subsequently patterned to form various additional metal interconnect structures or metal pads. The metallic layer (6, 7, 8) is magnified along the vertical direction with a higher magnification scale than the device layer 4 and the semiconductor substrate 2 to illustrate components thereof. The device layer 4 includes various devices and patterns that are repeated with a two-dimensional periodicity to define a two-dimensional array of semiconductor dies 9 on the device wafer 10. After completion of all subsequent processing steps on the device wafer 10, the device wafer 10 may be diced along dicing channels between neighboring pairs of semiconductor dies 9 to singulate the semiconductor dies 9.

The metallic layer (6, 7, 8) may comprise a metallic barrier liner 6, a copper seed layer 7, and an electroplated copper layer 8. The metallic barrier liner 6 typically comprises a conductive metallic nitride, such as TiN, TaN, WN, and/or MoN, and/or a refractory metal, such as Ti or Ta, may be deposited by physical vapor deposition or chemical vapor deposition, and may have a thickness in a range from 5 nm to 100 nm, although lesser and greater thicknesses may also be employed. The copper seed layer 7 consists essentially of copper, may be deposited by physical vapor deposition, and may have a thickness in a range from 20 nm to 100 nm, although lesser and greater thicknesses may also be employed. The electroplated copper layer 8 consists essentially of copper, may be deposited by electroplating, and may have a thickness in a range from 500 nm to 10,000 nm, although lesser and greater thicknesses may be employed. The electroplated copper layer 8 may be deposited employing a lip seal that covers a peripheral annular area of the device wafer 10 during the electroplating process that forms the electroplated copper layer 8. An "edge cut" feature is present in the electroplated copper layer 8, which means that the electroplated copper layer 8 is not deposited within an edge exclusion distance d_ee from the outermost periphery of the device wafer 10. The edge exclusion distance d_ee is typically about 1 mm, although lesser and greater dimensions may also be employed. In alternative embodiments, the metallic barrier liner 6 and/or the copper seed layer 7, may be omitted. In other alternative embodiments, a metal other than copper layer 8 may be present and removed by the ERB process.

An edge bevel removal process can be subsequently performed to remove portions of the copper seed layer 7 and the electroplated copper layer 8 that are located within a uniform distance from the outermost periphery of the device wafer 10. This uniform distance is herein referred to as an edge bevel removal distance d_ebr. The edge bevel removal process completely removes the portions of the copper seed layer 7 and the electroplated copper layer 8 that are located in a "bevel region" of the device wafer 10, which refers to the portion of the device wafer 10 in which the semiconductor substrate 2 has a beveled top surface, i.e., a non-horizontal top surface. Further, the edge bevel removal distance d_ebr can be set such that additional portions of the copper seed layer 7 and the electroplated copper layer 8 that are located over a horizontally-extending portion of the top surface of the semiconductor substrate 2 and proximal to the bevel region of the wafer are also removed. Typically, the edge bevel removal distance d_ebr can be set in a range from 1.5 mm to 3 mm, although lesser and greater edge bevel removal distances d_ebr may also be employed.

The edge bevel removal process can be performed by mounting the device wafer 10 on a chuck, and by directing an etchant liquid that etches copper toward a peripheral portion of the layer stack including the copper seed layer 7 and the electroplated copper layer 8. The etchant liquid 80 may comprise any solution that etches copper. Typically, the etchant liquid 80 is selected to etch copper selective to the material of the metallic barrier liner 6 to prevent collateral etching of the materials in the device layer 4. For example, the etchant liquid 80 may comprise a mixture of sulfuric acid and hydrogen peroxide. The etchant liquid 80 is applied radially outward while the device wafer 10 is spinning on a rotating chuck to ensure that the etchant liquid 80 stays outside an area defined by the lateral inward offset by the edge bevel removal distance d_ebr from the outmost periphery of the device wafer 10. If a notch or a flat is present on the device wafer 10, the boundary for keeping the etchant liquid 80 outward from may be suitably adjusted near the notch or the flat.

During application of the etchant liquid to the periphery of the device wafer 10, a dispensation nozzle (i.e., the EBR wet etchant nozzle) for applying the etchant liquid is positioned over the device wafer 10 and is oriented radially outward such that the movement direction of the dispensed etchant liquid is outward. Further, the spinning of the device wafer 10 applies a centrifugal force to the dispensed etchant liquid. The combination of the dispensation direction of the etchant liquid and the centrifugal force tends to keep the dispensed etchant liquid outside a protected area of the device wafer 10 that is defined by the lateral inward offset by the edge bevel removal distance d_ebr from the outmost periphery of the device wafer 10.

However, as shown in FIG. 1C, the present inventors realized that collaterally etched regions 89 within the protected area of the device wafer 10 may be unintentionally etched by the etchant liquid. The thickness of the electroplated copper layer 8 has a local reduction in the collaterally etched regions 89. This feature has a deleterious effect on a subsequent chemical mechanical polishing step in which severe dishing of the underlying portion of the top surface of the device layer 4 can occur, and structures proximate to the underlying portion of the top surface of the device layer 4 can be damaged. The distribution of the collaterally etched regions 89 may be random, and is believed to be due to the operational principle of an edge bevel removal apparatus employed to perform the edge bevel removal process.

Figure 2:
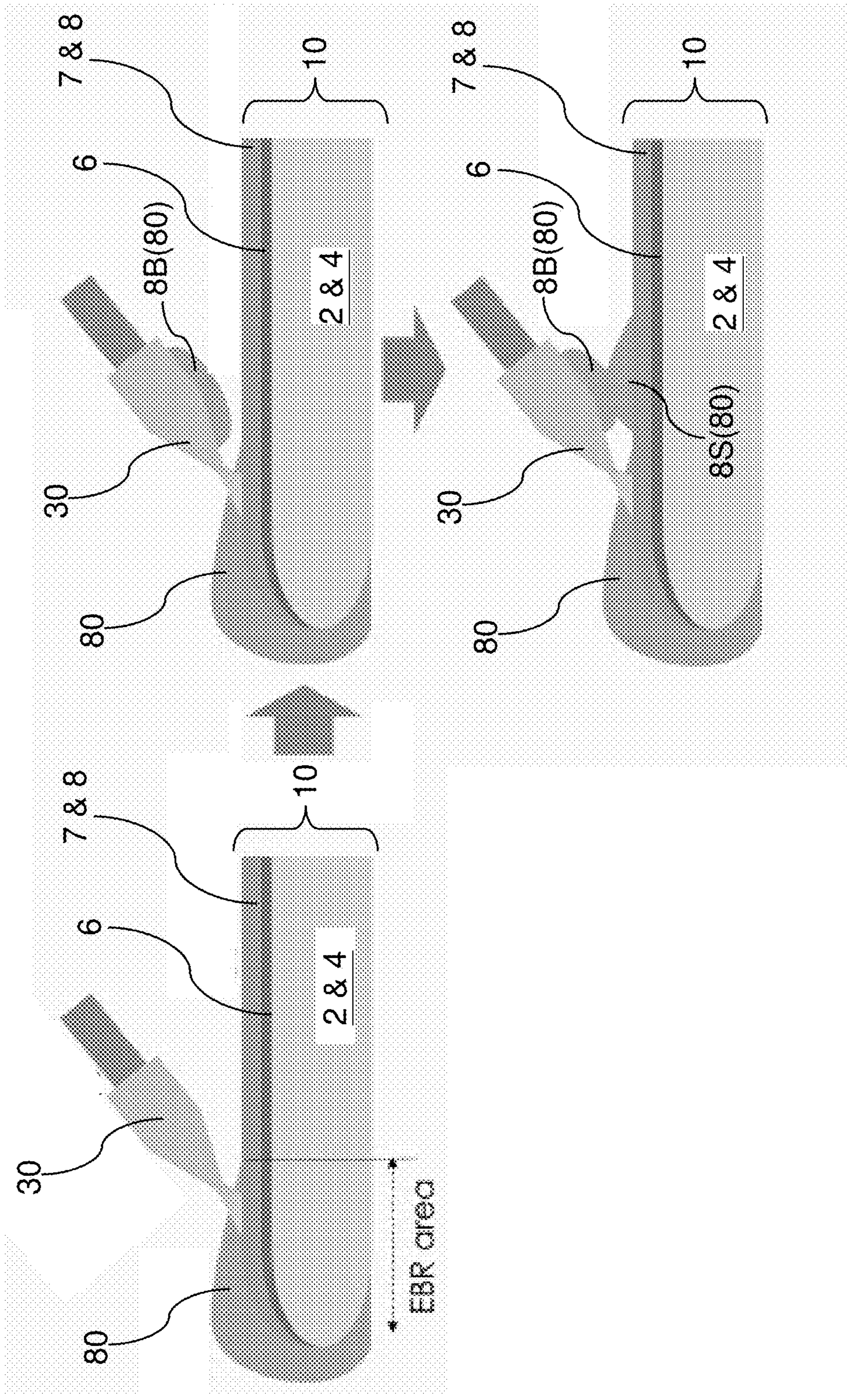
FIG. 2 (Prior Art)
FIG. 2 illustrates a first mechanism for deleterious collateral etching of a conductive layer from within a region that should not be etched.

FIG. 2 illustrates a first mechanism for a deleterious collateral etching of a material layer during the EBR process from within a region that should not be etched. During the edge bevel removal process illustrated in FIG. 2, the liquid dispensation nozzle (i.e., the EBR wet etchant nozzle) 30 is positioned over the device wafer 10, and is directed downward and radially outward toward a peripheral region of device wafer 10. During dispensation of an etchant liquid 80 from the orifice of the liquid dispensation nozzle 30, the etchant liquid 80 (e.g., mixture of sulfuric acid and hydrogen peroxide for etching copper) is directed at the peripheral area of the device wafer 10. The centrifugal force generated by the spinning of the device wafer 10 and applied to the portion of the etchant liquid 80 on the device wafer 10 causes the portion of the etchant liquid 80 on the device wafer 10 to stay farther outward than a threshold distance from the center of the device wafer 10. The minimum distance between the portion of the etchant liquid 80 on the device wafer 10 and the center of the device wafer 10 defines the protection region of the device wafer 10. The applied etchant liquid 80 remains in the edge bevel removal area (i.e., the EBR area), which is the area located outside the protected area.

The etchant liquid 80 is subjected to various forces while being dispensed out of the orifice of the liquid dispensation nozzle 30. A phenomenon known as Coanda effect occurs at the bottom of the orifice of the liquid dispensation nozzle 30 and on the bottom surface of the liquid dispensation nozzle 30. The Coanda effect is a phenomenon in which a fluid adheres to and follows the contour of a surface near an orifice out of which a main flow of the liquid is discharged. The Coanda effect causes a portion of a liquid to stay attached to a surface, and especially a convex surface, which is proximate to the orifice of the liquid dispensation nozzle 30.

The Coanda effect around the orifice of the liquid dispensation nozzle 30 causes a backside droplet 8B of the etchant liquid 80 to accumulate and to grow on a bottom surface segment and/or a backside surface segment of the liquid dispensation nozzle 30. When the backside droplet 8B accumulates a sufficient volume, the force of gravity applied to the backside droplet 8B can exceed the surface tension between the backside droplet 8B and the backside surface of the liquid dispensation nozzle 30, and a portion of the backside droplet 8B falls onto a protection region of the wafer as a surface droplet 8S of the etchant liquid 80. The surface droplet 8S is rapidly detached from the remaining portion of the backside droplet 8B because the liquid dispensation nozzle 30 is stationary and the device wafer 10 is rotating. However, the surface droplet 8S can etch a significant portion of the metallic layer underneath, which includes a stack of a copper seed layer 7 and an electroplated copper layer 8. A collaterally etched region 89 described with reference to FIGS. 1A-1C may be formed in this manner. This mode of formation of collaterally etched regions 89 is herein referred to as a Coanda collateral etch mode.

Figure 3:
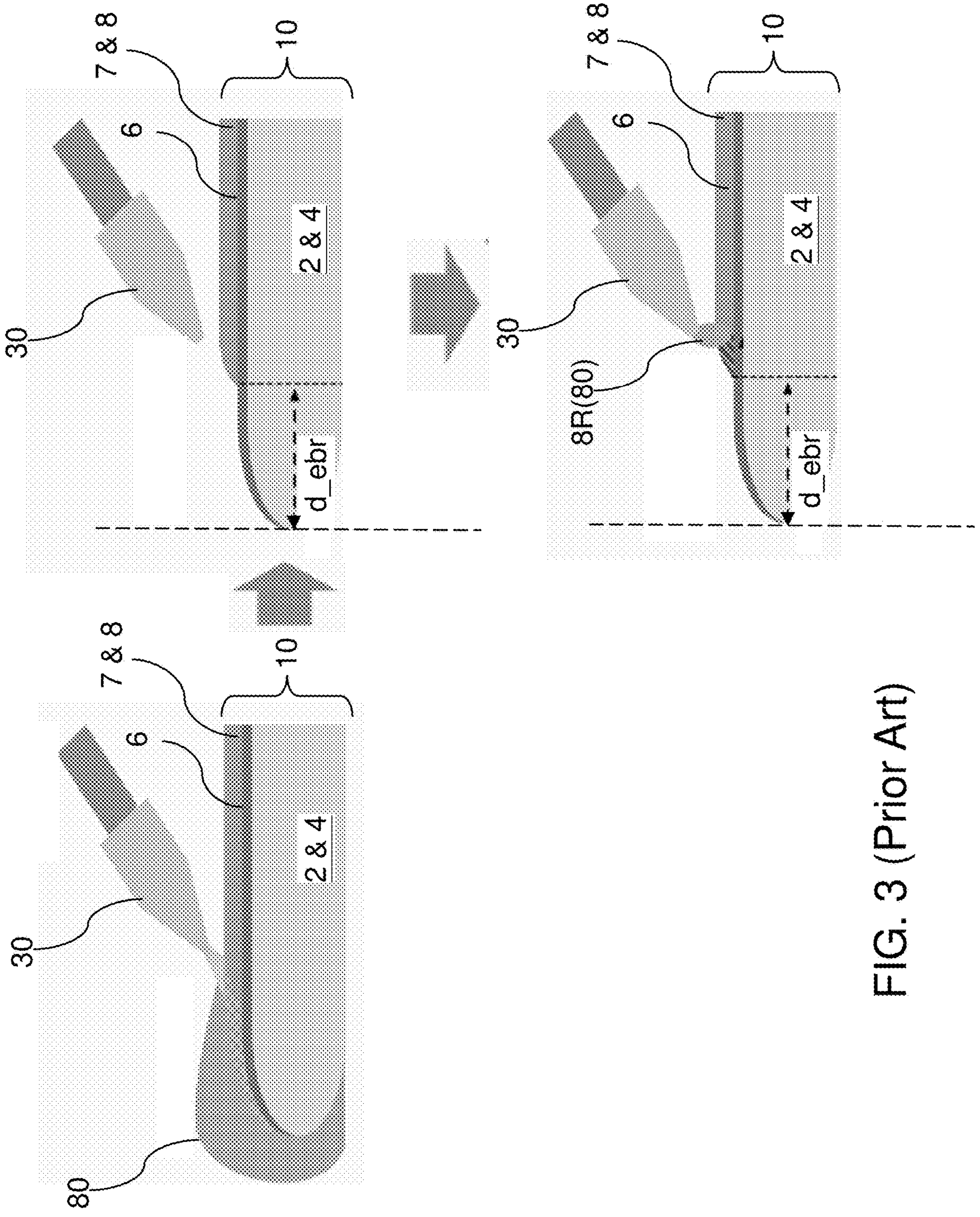
FIG. 3 (Prior Art)
FIG. 3 illustrates a second mechanism for deleterious collateral etching of a conductive layer from within a region that should not be etched.
Figure 4:
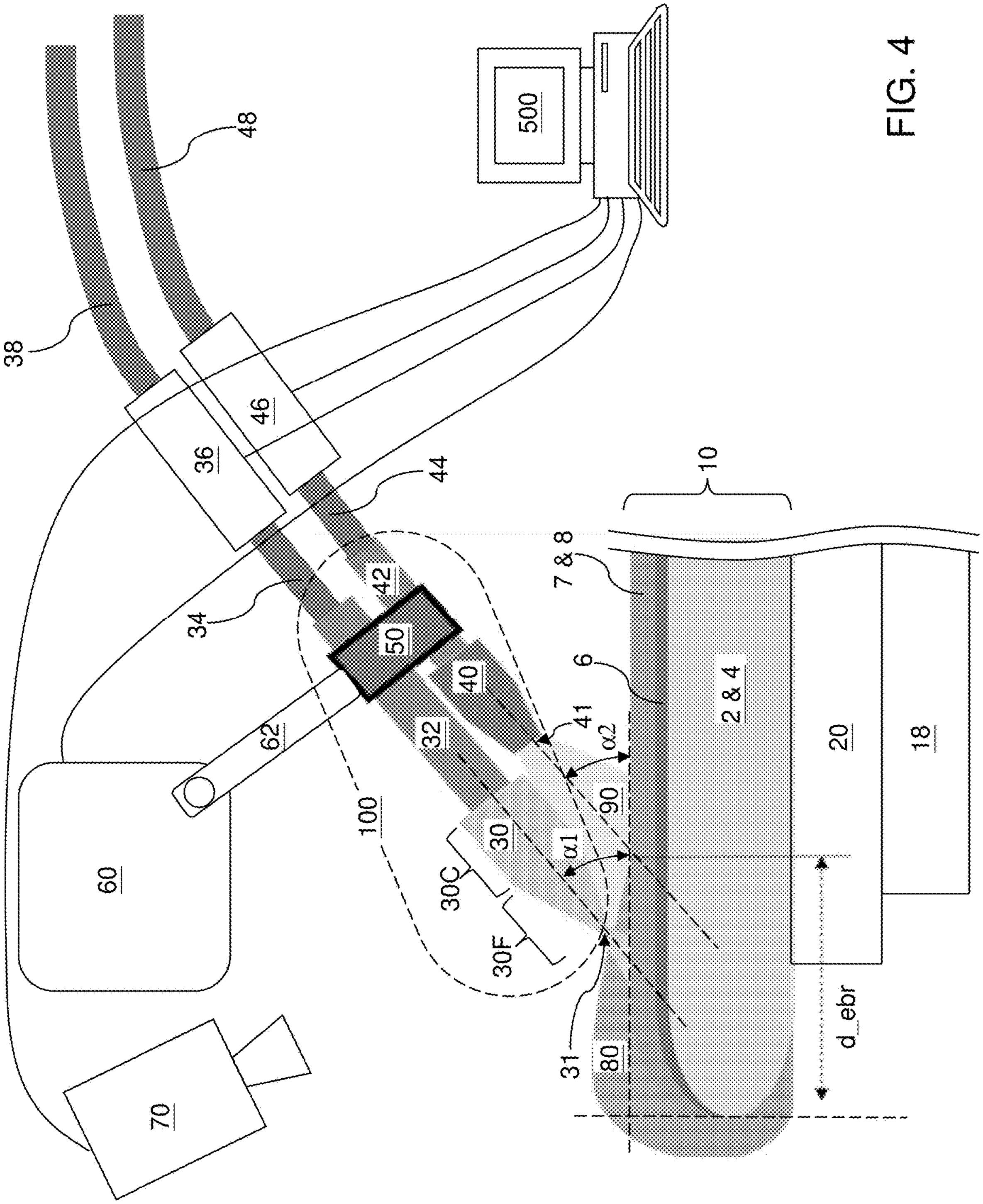
FIG. 4 illustrates operation of an edge bevel removal apparatus of the present disclosure during a normal operational mode according to an embodiment of the present disclosure.

FIG. 3 illustrates a second mechanism for a deleterious collateral etching of a material layer from within a region that should not be etched. In this case, the etchant liquid 80 may remain outside the protection region during the steady state of the edge bevel removal process in which the device wafer 10 rotates, and the dispensed portion of the etchant liquid 80 is continually pushed outward due to the centrifugal force. Even through the orifice of the liquid dispensation nozzle 30 is located within the area of the protection region in a top-down view, this arrangement does not cause a problem because a stream (e.g., jet) of the etchant liquid 80 is dispensed with a sufficient velocity to avoid falling of the etchant liquid 80 in an area that underlies the liquid dispensation nozzle 30. Upon termination of the liquid dispensation step, however, a residual drop 8R of the etchant liquid 80 may be present at the orifice of the liquid dispensation nozzle 30. When the residual drop 8R of the etchant liquid 80 falls onto the wafer, the residual drop 8R does not have any lateral velocity, and falls within the protection region of the device wafer 10 that should not be etched by the etchant liquid 80. A collaterally etched region 89 described with reference to FIGS. 1A-1C may be formed in this manner. This mode of formation of collaterally etched regions 89 is herein referred to as a residual solution drop mode, or a residual etchant drop mode.

Additionally or alternatively, the flow velocity of the jet of the etchant liquid 80 can be poorly defined during initiation of the application of the jet of the etchant liquid 80 onto the device wafer 10. The dispensed portion of the etchant liquid 80 from the orifice of the liquid dispensation nozzle 30 during turn-on of the stream of the etchant liquid 80 may have insufficient dispensation speed or excessive dispensation speed due to the transient variations in the pressure at the orifice of the liquid dispensation nozzle 30, and spillage of the etchant liquid 80 within the protected area of device wafer 10 may occur, resulting in formation of collaterally etched regions 89.

The size of the collaterally etched regions 89 may be reduced if a diluted etchant providing a lower etch rate is employed for the edge bevel removal process. However, use of such a diluted etchant results in a longer etch time, and inefficient utilization of the edge bevel removal tools.

According to an aspect of the present disclosure, an edge bevel removal apparatus includes a gas dispensation nozzle 40 which eliminates or reduces formation of collaterally etched regions 89 during or after the edge bevel removal process. The embodiment edge bevel removal apparatus comprises: a chuck 20 configured to hold a device wafer 10 thereupon; a nozzle assembly 100 comprising a liquid dispensation nozzle 30 configured to dispense an etchant liquid 80, and a gas dispensation nozzle 40 configured to dispense a gas (e.g., a gas stream) 90; and a process controller 500 configured to control the liquid dispensation nozzle 30 and the gas dispensation nozzle 40 and configured to perform an etchant liquid dispensation process in which a stream (e.g., jet) of the etchant liquid 80 is dispensed from an orifice 31 of the liquid dispensation nozzle 30 toward a peripheral region of a top surface of a device wafer 10 while a stream (e.g., jet) of the gas 90 is directed at a bottom surface of the liquid dispensation nozzle 30 such that a gas stream (e.g., jet) 90 flows along the bottom surface of the liquid dispensation nozzle 30 toward the orifice 31 of the liquid dispensation nozzle 30. The top surface of the device wafer 10 may be the top surface of the metallic layer (6, 7, 8), which may include a metallic barrier liner 6, a copper seed layer 7, and an electroplated copper layer 8.

The etchant liquid 80 comprises a liquid phase etchant that etches the material of the metallic layer (6, 7, 8). In one embodiment, the etchant liquid 80 comprises a liquid phase etchant that etches copper in the stack of the copper seed layer 7 and the electroplated copper layer 8 selective to the metallic nitride material in the metallic barrier liner 6. In one embodiment, the etchant liquid 80 may comprise a mix of sulfuric acid and hydrogen peroxide. The gas 90 comprises an inert gas such as dry air, nitrogen, and/or argon.

The etchant liquid dispensation process is initiated while the device wafer 10 is mounted on a chuck 20, and rotates around an axis passing through the geometrical center of the device wafer 10 and through the geometrical center of the chuck 20. Generally, the chuck 20 may have a shape of a circular plate, and the device wafer 10 can be mounted on the top surface of the chuck 20 such that the geometrical center of the device wafer 10 is positioned at a vertical axis passing through the geometrical center of the chuck 20. The device wafer 10 can be attached to the chuck 20 through vacuum suction and/or through side chucks. In one embodiment, the chuck 20 may comprise three or more support points with side chucks (e.g., side barriers or restraints) which mechanically secure the device wafer 10 on the chuck 20 support points. A chuck rotation mechanism 18 can be provided underneath the chuck 20 to rotate the chuck 20 and the device wafer 10 around the vertical axis passing through the center of the chuck 20. The angular speed of rotation of the device wafer 10 and the chuck 20 during the etchant liquid dispensation process is selected to ensure that sufficient centrifugal force is applied to a dispensed portion of the etchant liquid 80, and may be in a range from 150 revolutions per minute (rpm) to 400 rpm, such as from 225 rpm to 350 rpm, although lesser and greater angular speeds of rotation may also be employed.

The gas 90 stream may have laminar gas flow characteristics. A laminar flow refers to a smooth, orderly movement of a fluid in which adjacent layers of the fluid glide parallel among one another without significant mixing or disruption. In a laminar flow, the fluid particles follow well-defined paths, and the flow pattern is characterized by a lack of significant turbulence. According to an aspect of the present disclosure, the gas dispensation nozzle 40 is positioned such that a terminal portion of the laminar flow of the gas 90 stream transfers momentum to the stream of the etchant liquid 80 along a lateral direction toward an edge of the top surface of the device wafer 10. In one embodiment, the stream of the etchant liquid 80 is directed toward the top surface of the device wafer 10 at a first non-zero and non-orthogonal tilt angle $\alpha 1$ relative to a horizontal plane including the top surface of the device wafer 10. In one embodiment, the stream of the gas 90 is directed toward the top surface of the device wafer 10 at a second non-zero and non-orthogonal tilt angle $\alpha 2$ relative to the horizontal plane including the top surface of the device wafer 10. In this case, the jet of the gas 90 transfers downward and outward momentum to a portion of the etchant liquid 80 that is present on the top surface of the device wafer 10, and thereby assists in outward movement of the dispensed portion of the etchant liquid 80 on the top surface of the device wafer 10.

The gas dispensation nozzle 40 can be located on the backside of the liquid dispensation nozzle 30. In one embodiment, the orifice 41 of the gas dispensation nozzle 40 may be offset inward along a radial direction of the device wafer 10 from the backside of the liquid dispensation nozzle 30. In one embodiment, the axial direction and the dispensation direction of the gas dispensation nozzle 40 may be parallel to the axial direction and the dispensation direction of the liquid dispensation nozzle 30. In this case, the second non-zero and non-orthogonal tilt angle $\alpha 2$ may be the same as the first non-zero and non-orthogonal tilt angle $\alpha 1$. Alternatively, second non-zero and non-orthogonal tilt angle $\alpha 2$ may be smaller than the first non-zero and non-orthogonal tilt angle $\alpha 1$ by a differential angle ($\alpha 1$-$\alpha 2$), which may be in a range from 0.01 degree to 5 degrees. The value of the first non-zero and non-orthogonal tilt angle $\alpha 1$ may be in a range from 40 degrees to 55 degrees, such as 45 degrees to 50 degrees although lesser and greater values may also be employed.

In one embodiment, the stream (e.g., jet) of the gas 90 is directed at a point within the top surface of the device wafer 10 that is more distal from an edge of the top surface of the device wafer 10 than a most distal surface of a portion of the etchant liquid 80 that is present on the top surface of the device wafer 10. This alignment ensures that the momentum transfer from the stream of the gas 90 to the dispensed portion of the etchant liquid 80 is always radially outward, and splashing of the etchant liquid 80 by the stream of the gas 90 does not occur or is minimized.

In one embodiment, the liquid dispensation nozzle 30 comprises a conical frustum portion 30F containing the orifice 31 at a narrow end thereof and further comprises a cylindrical portion 30C that is adjoined to a rear of the conical frustum portion 30F. The jet of the gas 90 is directed at a bottom surface of the cylindrical portion 30C. The laminar flow of the gas 90 extends underneath the cylindrical portion 30C and the conical frustum portion 30F. In one embodiment, the nozzle assembly 100 comprises an optional clamp structure 50 configured to hold the gas dispensation nozzle 40 at a fixed position relative to a position of the liquid dispensation nozzle 30. In one embodiment, the liquid dispensation nozzle 30 is oriented such that a primary spray direction of the stream of the gas 90 is parallel to a primary spray direction of the stream of etchant liquid 80 from the liquid dispensation nozzle 30.

In one embodiment, the nozzle assembly 100 comprises a first conduit 32 affixed to a rear of the liquid dispensation nozzle 30, attached to the clamp structure 50, and configured to flow the etchant liquid 80 therethrough, and a second conduit 42 affixed to a rear of the gas dispensation nozzle 40, attached to the clamp structure 50, and configured to flow the gas 90 therethrough. In one embodiment, the first conduit 32 has sufficient mechanical rigidity and strength for mounting into a first opening in the clamp structure 50, and a second conduit 42 has sufficient mechanical strength for mounting to a second opening in the clamp structure 50. The outlet of the first conduit 32 can be connected to a supply-side opening of the liquid dispensation nozzle 30, and the outlet of the second conduit 42 can be connected to a supply-side opening of the gas dispensation nozzle 40.

The first conduit 32 can be connected to a reservoir of the etchant liquid (i.e., a liquid etchant supply) through a first liquid supply pipe 34, a first mass flow controller (e.g., valve) 36 configured to control the flow rate of the etchant liquid 80 therethrough, and a second liquid supply pipe 38. The second conduit 42 can be connected to a gas supply (which may be a pressurized gas (e.g., nitrogen or argon) tank or an in-house gas (e.g., air) supply system) through a first gas supply pipe 44, a second mass flow controller (e.g., valve) 46 configured to control the flow rate of the gas 90 therethrough, and a second gas supply pipe 48. The process controller 500 can set the target values for the flow rate of the etchant liquid 80 through the first mass flow controller 36. Further, the process controller 500 can set the target values for the flow rate of the gas 90 through the second mass flow controller 46. Thus, the process controller 500 can control the flow rate of the etchant liquid 80 out of the liquid dispensation nozzle 30, and can control the flow rate of the gas 90 out of the gas dispensation nozzle 40.

In one embodiment, the edge bevel removal apparatus may also comprise an optional dispenser actuation mechanism 60 and a dispenser actuation arm 62 that are configured to laterally and/or vertically move and/or rotate the nozzle assembly 100. In one embodiment, the dispenser actuation arm 62 may be connected to the clamp structure 50. In one embodiment, an optional video camera 70 may be provided for monitoring the location of the edge of the dispensed portion of the etchant liquid 80 on the top surface of the device wafer 10. Alternatively, the video camera 70 may be omitted.

Generally, a stream of the etchant liquid 80 is dispensed from an orifice 31 of the liquid dispensation nozzle 30 toward a peripheral region of a top surface of a device wafer 10 while a stream of the gas 90 is directed at a bottom surface of the liquid dispensation nozzle 30 during the etchant liquid dispensation process. A laminar flow of the gas 90 flows along the bottom surface of the liquid dispensation nozzle 30 toward the orifice 31 of the liquid dispensation nozzle 30 during the etchant liquid dispensation process.

In one embodiment, the process controller 500 may be programmed to perform a pre-dispensation preparation process in which the stream of gas 90 is turned on while the etchant liquid 80 is not dispensed from the orifice 31 of the liquid dispensation nozzle 30 prior to performing the etchant liquid dispensation process. This mode of operation prevents or reduces formation of collaterally etched regions 89 by causing any droplet of the etchant liquid 80 that may form around the orifice 31 of the liquid dispensation nozzle 30 prior to performing the etchant liquid dispensation process to fly off outward away from the protection region of the device wafer 10 that should be protected from the etchant liquid 80.

In one embodiment, the process controller 500 may be programmed to perform a post-dispensation purge process in which the stream of gas 90 is turned on while the etchant liquid 80 is not dispensed from the orifice 31 of the liquid dispensation nozzle 30 after performing the etchant liquid dispensation process. This mode of operation prevents or reduces formation of collaterally etched regions 89 by causing any droplet of the etchant liquid 80 that may form around the orifice 31 of the liquid dispensation nozzle 30 after performing the etchant liquid dispensation process to fly off outward away from the protection region of the device wafer 10 that should be protected from the etchant liquid 80.

In one embodiment, the process controller 500 may be programmed to perform a series of steps during the etchant liquid dispensation process. For example, the etchant liquid dispensation process may comprise: a main dispensation step during which the stream of gas 90 is turned on at a normal flow rate; a commencement step during which the stream of gas 90 is turned on at a first enhanced rate that is higher than the normal flow rate; and a termination step during which the stream of gas 90 is turned on at a second enhanced rate that is higher than the normal flow rate.

In one embodiment, the process controller 500 may be programmed to monitor a periphery of a dispensed portion of the etchant liquid 80 over the top surface of the device wafer 10 employing the optional video camera 70, and to maintain a distance between and edge of the top surface of the device wafer 10 and the periphery of the dispensed portion of the etchant liquid 80 within a predetermined distance range, which may be the target value+/−maximum deviation tolerance for the edge bevel removal distance d_ebr.

In one embodiment, the device wafer 10 comprises a semiconductor wafer 2 including semiconductor devices and metal interconnect structures (e.g., device layer 4) thereupon, a continuous copper layer (7, 8) is present on the top surface of the device wafer 10, and the etchant liquid 80 etches copper.

The embodiment edge bevel removal apparatus avoids or reduces the deleterious effects of the Coanda effect as discussed with reference to FIG. 2 and/or the unintended dripping of droplets of the etchant liquid 80 as discussed with reference to FIG. 3.

Figure 5:
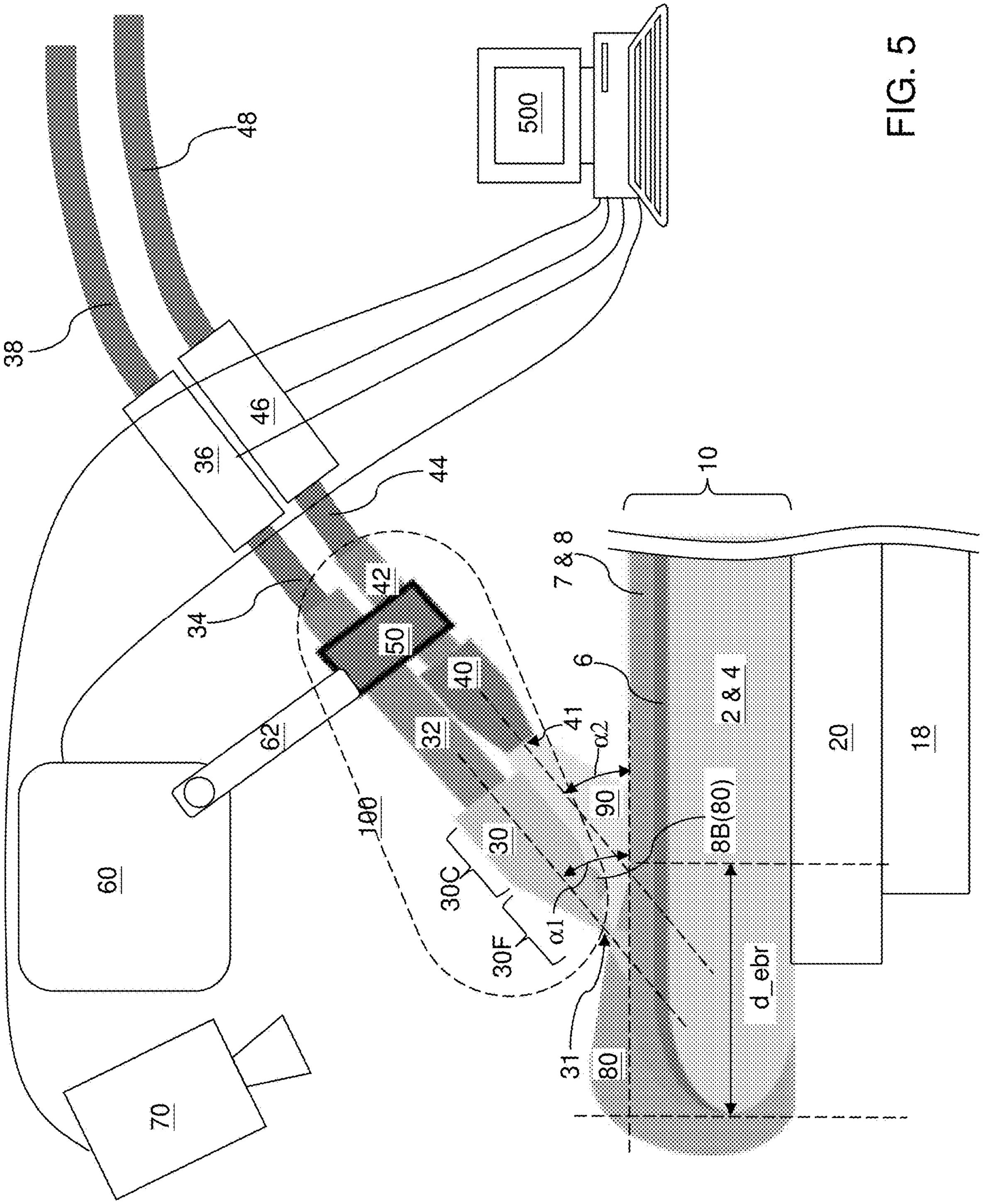
FIG. 5 illustrates operation of the edge bevel removal apparatus of the present disclosure in case a wetting of a backside surface of a liquid dispensation nozzle occurs according to an embodiment of the present disclosure.

Referring to FIG. 5, the mechanism for suppressing growth of a backside droplet 8B on the bottom side of the liquid dispensation nozzle 30 is illustrated. The stream of the gas 90 provides a laminar flow beneath the backside of the liquid dispensation nozzle 30, and constantly transfers lateral momentum to any backside droplet 8B that may begin to form adjacent to the orifice 31 of the liquid dispensation nozzle 30. The constant transfer of the momentum from the stream of the gas 90 to the backside droplet 8B prevents or reduces growth of the backside droplet 8B to a sufficient size for the gravitational force on the backside droplet 8B to overcome the surface tension of the backside droplet 8B. Thus, even if a backside droplet 8B were to be formed underneath the orifice 31 of the liquid dispensation nozzle 30, the backside droplet 8B does not fall on the top surface of the device wafer 10.

Figure 6:
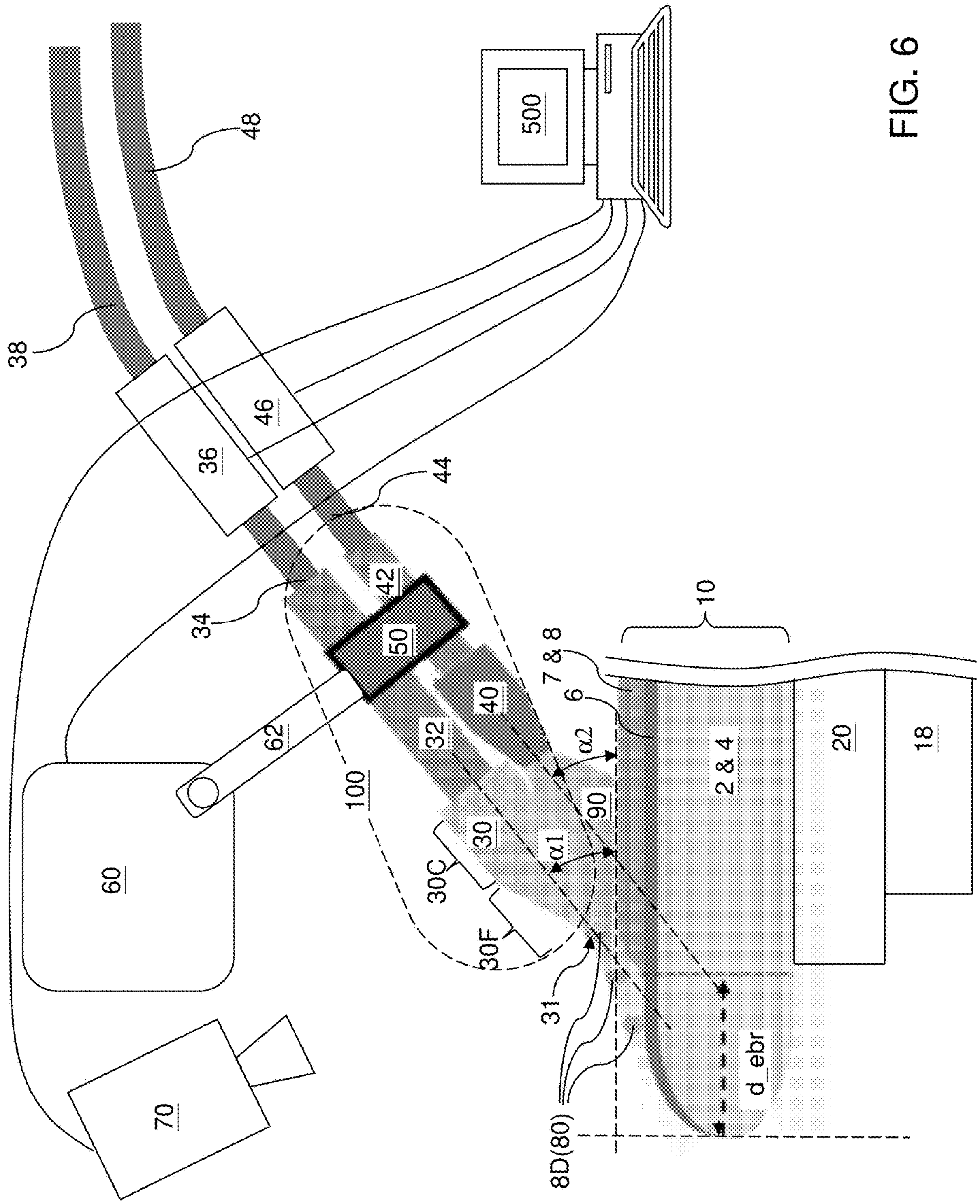
FIG. 6 illustrates operation of the edge bevel removal apparatus of the present disclosure in case droplets of an etchant liquid accidentally falls off the liquid dispensation nozzle according to an embodiment of the present disclosure.

Referring to FIG. 6, the mechanism for preventing or reducing dropping of droplet 8D of the etchant liquid 80 on the bottom side of the liquid dispensation nozzle 30 is illustrated. The stream of the gas 90 provides a laminar flow beneath the backside of the liquid dispensation nozzle 30 prior to and after the etchant liquid dispensation process. The droplet 8D of the etchant liquid 80 that may form around the orifice 31 of the liquid dispensation nozzle 30 is blown away from above the protection region of the device wafer 10 into the area of the edge bevel removal region that is located within the edge bevel removal distance d_ebr from the outermost periphery of the device wafer 10. Thus, the droplet 8D of the etchant liquid 80, if present, falls into the area of the edge bevel removal region, and does not fall on the top surface of the device wafer 10 in the protection region.

Figure 7:
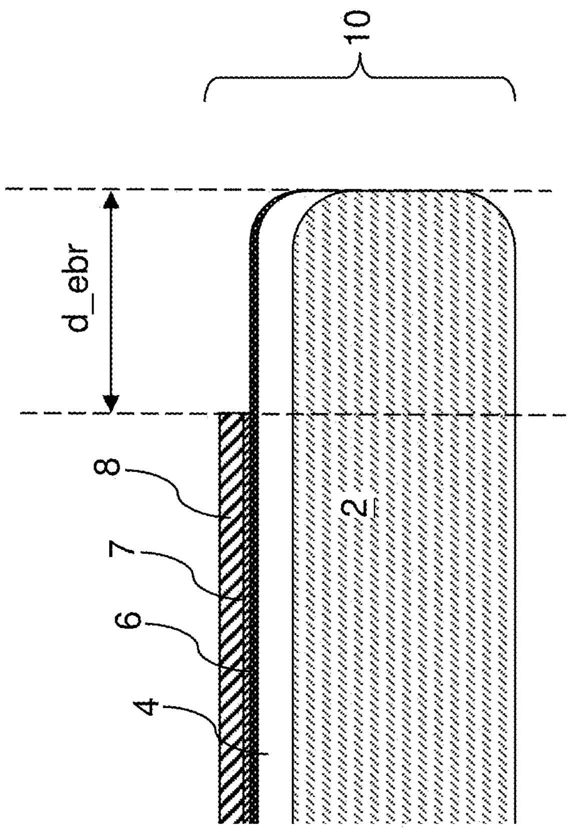
FIG. 7 is a magnified view of a region of a wafer after performing the edge bevel removal process of the present disclosure.

Referring to FIG. 7, is a magnified view of a region of a device wafer 10 is illustrated after performing the embodiment edge bevel removal process. The device wafer 10 after the embodiment edge bevel removal process may be free of any collaterally etched region 89 or may include a lower number of the collaterally etched regions 89. Thus, the copper layer (7, 8) on the top surface of the device wafer 10 has a more uniform thickness distribution, and the process yield of a subsequent chemical mechanical polishing process can be enhanced. In one embodiment, the edge bevel removal distance d_ebr may be reduced to a range from 1.2 mm to 2.0 mm due to the enhanced control of the distribution area of the etchant liquid 80. A larger fraction of the entire area of the device wafer 10 may be employed for manufacture of devices through use of the embodiment edge bevel removal apparatus.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph or in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A method of performing an edge bevel removal process, comprising:

providing a nozzle assembly comprising a liquid dispensation nozzle configured to dispense an etchant liquid and a gas dispensation nozzle configured to dispense a gas, wherein the gas dispensation nozzle is located below the liquid dispensation nozzle, and is radially offset inward relative to the liquid dispensation nozzle; and performing an etchant liquid dispensation process in which a stream of the etchant liquid is dispensed from an orifice of the liquid dispensation nozzle toward a peripheral region of a top surface of a device wafer while a stream of the gas is directed at a bottom surface of the liquid dispensation nozzle such that a laminar flow of the gas flows along the bottom surface of the liquid dispensation nozzle toward the orifice of the liquid dispensation nozzle during the etchant liquid dispensation process, wherein the laminar flow of the gas transfers momentum to the stream of the etchant liquid along a lateral direction toward an edge of the top surface of the device wafer to prevent or reduce growth of a droplet of the etchant liquid that forms on the bottom surface of the liquid dispensation nozzle due to Coanda effect to a sufficient size that would cause the droplet to drop due to gravitational force, such that the droplet does not fall on the top surface of the device wafer.

2. The method of claim 1, wherein the stream of the gas is directed toward the top surface of the device wafer at a non-zero and non-orthogonal tilt angle relative to a horizontal plane including the top surface of the device wafer such that the stream of the gas transfers downward and outward momentum to a portion of the etchant liquid that is present on the top surface of the device wafer.

3. The method of claim 1, wherein the stream of the gas is directed at a point within the top surface of the device wafer that is more distal from an edge of the top surface of the device wafer than a most distal surface of a portion of the etchant liquid that is present on the top surface of the device wafer.

4. The method of claim 1, wherein:

the liquid dispensation nozzle comprises a conical frustum portion containing the orifice at a narrow end thereof and further comprises a cylindrical portion that is adjoined to a rear of the conical frustum portion;

the stream of the gas is directed at a bottom surface of the cylindrical portion; and the laminar flow of the gas extends underneath the cylindrical portion and the conical frustum portion.

5. The method of claim 1, wherein the nozzle assembly further comprises a clamp structure configured to hold the gas dispensation nozzle at a fixed position relative to a position of the liquid dispensation nozzle.

6. The method of claim 5, wherein the nozzle assembly further comprises:

a first conduit affixed to a rear of the liquid dispensation nozzle, attached to the clamp structure, and configured to flow the etchant liquid therethrough; and a second conduit affixed to a rear of the gas dispensation nozzle, attached to the clamp structure, and configured to flow the gas therethrough.

7. The method of claim 1, wherein the liquid dispensation nozzle is oriented such that a primary spray direction of the stream of the gas is parallel to a primary spray direction of the stream of etchant liquid from the liquid dispensation nozzle.

8. The method of claim 1, further comprising performing a pre-dispensation preparation process in which the stream of gas is turned on while the etchant liquid is not dispensed from the orifice of the liquid dispensation nozzle prior to performing the etchant liquid dispensation process.

9. The method of claim 8, further comprising performing a post-dispensation purge process in which the stream of gas is turned on while the etchant liquid is not dispensed from the orifice of the liquid dispensation nozzle after performing the etchant liquid dispensation process.

10. The method of claim 1, wherein the etchant liquid dispensation process comprises:

a main dispensation step during which the stream of gas is turned on at a normal flow rate;

a commencement step during which the stream of gas is turned on at a first enhanced rate that is higher than the normal flow rate; and a termination step during which the stream of gas is turned on at a second enhanced rate that is higher than the normal flow rate.

11. The method of claim 1, wherein:

the device wafer comprises a semiconductor wafer including semiconductor devices and metal interconnect structures thereupon, and a layer of copper located over the semiconductor devices; and the stream of the etchant liquid etches the layer of copper located in the peripheral region of the top surface of the device wafer.

12. The method of claim 11, wherein the etchant liquid comprises a mixture of sulfuric acid and hydrogen peroxide, and the stream of the gas comprises air, nitrogen or argon.

13. The method of claim 1, further comprising maintaining an alignment between the liquid dispensation nozzle and the gas dispensation nozzle during the etchant liquid dispensation process using a mechanical support structure.

14. The method of claim 1, further comprising rotating the device wafer at a variable speed during the etchant liquid dispensation process to control distribution of the etchant liquid on the top surface of the device wafer using a chuck rotation mechanism.

15. The method of claim 1, further comprising adjusting a flow rate of an etchant liquid and a flow rate of the gas based on real-time feedback from a sensor monitoring the edge bevel removal process.

16. The method of claim 1, further comprising monitoring a position of an edge of a dispensed portion of the etchant liquid on the top surface of the device wafer using a video camera.

17. The method of claim 1, wherein:

the liquid dispensation nozzle is tilted along a radial direction by a first angle relative to a horizontal plane so that the etchant liquid is dispensed outward along a radial direction; and the gas dispensation nozzle is tilted along the radial direction by a second angle relative to the horizontal plane so that the gas is dispensed outward along the radial direction.

18. The method of claim 17, wherein the second angle is not greater than the first angle.

19. The method of claim 17, wherein the first angle is in a range from 40 degrees to 55 degrees.

* * * * *